United States Patent [19]

Kennedy, Jr. et al.

[11] Patent Number: 4,803,497
[45] Date of Patent: Feb. 7, 1988

[54] LASER DIODE OUTPUT POWER STABILIZATION IN A LASER IMAGESETTER

[75] Inventors: John A. Kennedy, Jr., Ridge; Walter Hansen, Cold Spring Harbor, both of N.Y.

[73] Assignee: Dr.-Ing. Rudolf Hell GmbH, Kiel, Fed. Rep. of Germany

[21] Appl. No.: 91,681

[22] Filed: Aug. 31, 1987

[51] Int. Cl.$^4$ .............................................. G01D 9/42
[52] U.S. Cl. ..................................... 346/108; 358/300
[58] Field of Search ................. 346/108, 107 R, 76 L, 346/160; 358/296, 300, 302

[56] References Cited

U.S. PATENT DOCUMENTS

| | | | |
|---|---|---|---|
| 4,197,560 | 4/1980 | Minerd | 346/160 |
| 4,528,580 | 7/1985 | Inoue et al. | 346/160 |
| 4,580,044 | 4/1986 | Hongo et al. | 250/205 |
| 4,583,128 | 4/1986 | Anderson, Jr. et al. | 358/302 |
| 4,642,701 | 2/1987 | Maeda | 346/108 |
| 4,719,474 | 1/1988 | Hansen | 346/108 |

FOREIGN PATENT DOCUMENTS

0141191  5/1985  European Pat. Off. .
2101841  3/1985  United Kingdom .

*Primary Examiner*—E. A. Goldberg
*Assistant Examiner*—Mark Reinhart
*Attorney, Agent, or Firm*—Lawrence C. Edelman

[57] ABSTRACT

A laser diode imagesetter having multiple resolution operating modes, includes means for stabilizing the optical output power from the semiconductor laser diode during the scan trace interval across a photosensitive material so as to maintain a high extinction ratio for the laser diode even when its driving current is changed to a different level in order to operate the imagesetter at a different resolution mode.

13 Claims, 4 Drawing Sheets

LASER DIODE OUTPUT POWER STABILIZATION IN A LASER IMAGESETTER

BACKGROUND OF THE INVENTION

1. Field of the Invention

This invention relates to laser diode imagesetters having multiple resolution modes, and more particularly, to a method and apparatus for stabilization of the optical output power of a laser diode during the trace portion of a scan across a photosensitive material, irrespective of the resolution mode selected for the imagesetter.

2. Description of the Prior Art

Conventional laser imagesetters (e.g., typesetters or printers) have generally used lasers, such as helium-neon lasers, which generate a light beam used for recording or reproducing an image or text, either directly e.g., by exposing a photosensitive film or paper or indirectly, e.g., by photosensitive charging of an electrostatic recording device. Not only are such lasers and their accompanying power supply, modulator and modulator driver relatively expensive and power hungry, but their peak modulation rate is limited by the size of their output light beam. Thus, additional optical components are necessary, involving additional costs, in order to provide an improved modulation performance required for a high resolution imagesetter.

In contrast thereto, currently available semiconductor laser diodes in the milliwatt range can be readily modulated at rates up to 20 MHz by modulating its driving current. Consequently, it is desirable to use a semiconductor laser diode as the source of a modulated light beam for recording in a high resolution imagesetter. However, the use of a semiconductor laser diode in an imagesetting apparatus does have a drawback. That is, the optical power output of a laser diode is sensitive to changes in temperature of the laser diode. Thus, unwanted changes in the optical power output of the laser diode due to changes in temperature, can easily result in changes of the amount light energy which reaches the photosensitive material and thereby produce unwanted image variations. Although one would think that placing the laser diode in an oven or other temperature stabilized environment would solve this problem, it does not, since the temperature of the laser diode also changes due to heating effects inside the semiconductor structure of the laser diode.

Figure 1:
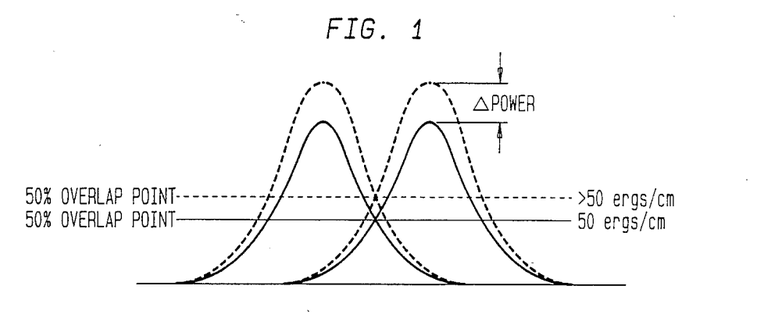
FIG. 1, previously described, illustrates the profiles of vertically adjacent spots produced on a photosensitive material in response to a scanning laser diode light beam.

In the past, relatively slight changes in optical power output due to internal heating of the laser diode was not a problem, however, with new high resolution imagesetter g. of the type described in U.S. Pat. No. 4,719.474, filed July 19, 1985 in the names of Hansen and Klepper, even slight variations of the optical power output can result in undesirable image distortions. This high resolution imagesetter is designed for a standard resolution of 1,200 dots per inch (dpi) when using a infrared photosensitive material such as the KODAK PAGI-SET IR (a trademark of the Kodak Company) phototypesetting paper available from the Eastman Kodak Co., Rochester, NY. This paper requires that the laser optical power output be such that 50 ergs/cm² reach the paper in order to make a spot thereon. The combination of the scanning operation of the light beam and the sensitivity of the photosensitive material is such that at the standard resolution, a spot of 22 micrometers is formed. The solid line curves in FIG. 1 illustrate vertically adjacent spots and show that the spot shape is generally Gaussin. The scanning operation is adjusted so that adjacent scan lines generally overlap at about their half-intensity (50%) points and results in a spot energy of 50 ergs/cm exposing the photosensitive material.

When the optical power reaching the photosensitive material is increased, as illustrated by the dashed line curves in FIG. 1, the point of overlap with a vertically adjacent spot, which is still at the 50% power level due to the scanning system, corresponds however to a greater optical power output and hence a larger spot size. This affect seems intuitively obvious, since the greater the power of the light reaching the photosensitive paper the greater the exposure and thus, the larger the diameter of the spot formed thereon. This change in spot size will cause an undesirable change in the exposed image size and/or density depending on the composition of the exposed image. It has been experimentally determined that laser optical power changes greater than even one percent can cause undesirable image distortions.

Conventional techniques for stabilizing the optical power output of a laser diode use a sample and hold circuit which samples the laser optical power output during each scan retrace interval and then provides an amount of drive current to the laser during the next scan trace interval which results in a laser optical power output corresponding with the sampled optical power output during the previous retrace interval. Although such stabilization techniques were sufficient in the past, the high sensitivity of the present day photosensitive material and high resolution requirements of todays high quality imagesetters, requires a greater degree of optical power output stabilization.

Laser diode optical power output fluctuations can result from changes in the internal operating temperature of a laser diode, which changes are a function of its applied drive current. Since its drive current is determined by the image-representative video signal which is applied to modulate the laser diode, the rate at which the laser diode temperature changes is less than a scan trace time. Therefore, these power fluctuations cannot be compensated for with the previously noted sample and hold technique. The sample and hold technique can only compensate for slower changes in temperature. Consequently, modulating the laser diode with a constant current during the scan trace (determined by the sample and hold circuit during the scan retrace interval) is not sufficient to stabilize the laser optical power output to the degree required for a high quality imagesetter.

Figure 2:
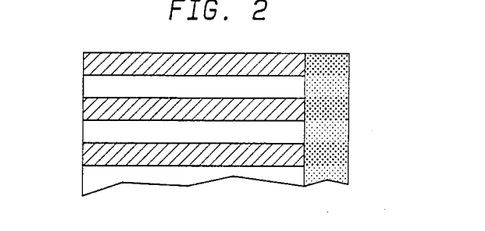
FIG. 2 previously described, illustrates an example of an image construction, which is particularly sensitive to changes in the optical power output of the laser diode.

The variation of image density can easily be noticed in certain types of image compositions. A worst case condition is representatively illustrated in FIG. 2, where a vertically oriented fine tint screen on the far right (near the end of scan trace) is alternately preceeded by a blank area (horizontal white bar) and then by a fully exposed area (horizontal black bar). The laser optical power output during the tint portion of the image will be slightly different between successive scan lines in which the laser has been OFF and in which the laser had been ON during the preceeding portion of that line scan. As previously noted, if the optical power output of the laser diode changes, the effective spot size on the photosensitive material will also change. Consequently, with an image composition such as illustrated in FIG. 2, a density variation is created in the tint portion of the image which appears as a horizontal "banding" within the vertical tinted portion.

It is desirable to provide a method and apparatus for stabilizing the optical Power output of a laser diode in a multi-resolution imagesetter during the scan trace portions of its operation, which method and apparatus will also take into account changes in laser beam optical power required for different resolution modes of the imagesetter.

SUMMARY OF THE INVENTION

In accordance with the principals of the present invention, a bias current is applied to the laser diode of an imagesetter during the scan trace portion of its operation. This bias current is applied when the laser diode is not being driven ON by the driving video information signal. Since temperature variations of the laser diode result from changes of its input power, the bias current decreases the change in input power to the laser diode as it is driven from its OFF to its ON states, thereby reducing its internal temperature variations and consequent optical power output variations during the scan trace periods. When a higher resolution mode of the imagesetter is selected, which requires a reduced laser optical power output, the applied bias current is maintained, in order to maintain stabilization of the laser diode optical power output due to internal temperature variations of the diode. However, instead of reducing the optical output power of the laser diode as would normally be done, the ON driving current of the laser diode is increased over that normally required for proper operation at the higher resolution mode. A filter is interposed into the optical light path of the laser diode in order to reduce the light energy provided by the laser diode to that amount necessary for proper operation of the imagesetter at the higher resolution mode.

The laser diode output during the higher resolution mode is increased in order to maintain a high extinction ratio for the laser diode which is necessary for good signal to noise characteristics in the reproduced image, while the filter reduces the laser diode optical power output to that level which is required for proper operation of the imagesetter at the higher resolution operating mode.

Other features and advantages of the invention will be apparent from the description of the preferred embodiments and from the claims. For a fuller understanding of the present invention, reference should now be made to the following detailed description of the preferred embodiments of the invention and to the accompanying drawings.

DESCRIPTION OF THE PREFERRED EMBODIMENTS

The preferred embodiments of the present invention will now be described with reference to FIGS. 3–8 of the drawings. Identical elements in the various figures are designated with the same reference numerals.

Figure 3:
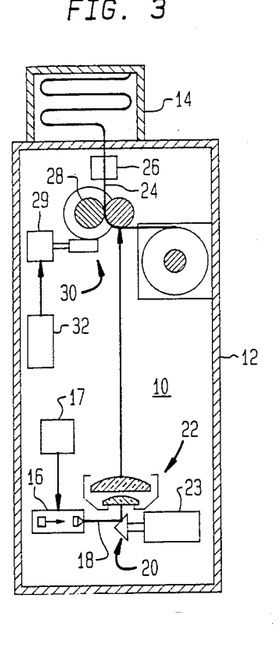
FIG. 3 illustrates a side view schematic of imagesetting apparatus of the type which includes laser diode stabilization in accordance with the principles of the present invention.
Figure 4:
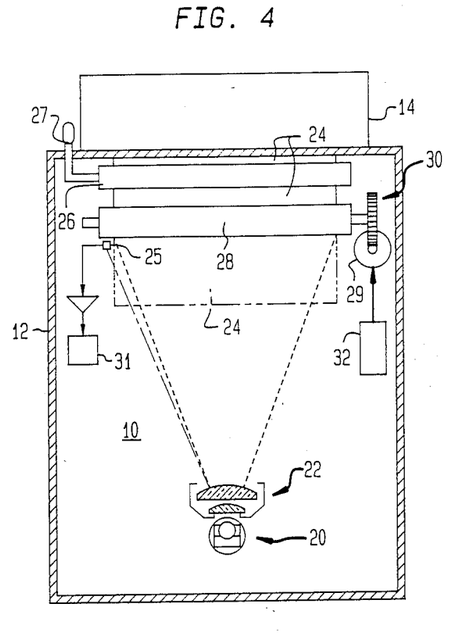
FIG. 4 illustrates a front view schematic of imagesetting apparatus of the type which includes laser diode stabilization in accordance with the principles of the present invention.

FIGS. 3 and 4 show side and front views, respectively, of phototypesetting apparatus 10 of the type to which the present invention relates. This typesetting apparatus provides a two-dimensional image on photosensitive material from an electrical representation, such as an externally applied video signal of this image. Apparatus 10 is enclosed in a housing 12 which includes at its top a light-tight receptacle 14 for receiving the photosensitive material on which images have been set.

Housing 12 contains the mechanical and electrical components used to form the image. These components include an integrated circuit semiconductor laser diode as a source 16 of electromagnetic radiation (for example, infrared light) which is controlled by control circuitry 17 responsive to an externally applied video signal (not shown) to emit a modulated light beam 18. A rotatable prism mirror 20 reflects light beam 18 toward a scan lens 22 which focusses light beam 18 into an image point on photosensitive material 24.

Rotatable prism mirror 20 is provided with two mirror facets that meet along a common line to form a triangular prism. The mirror or so called "spinner" 20 is driven by a high speed synchronous motor 23.

As mirror 20 is rotated, the beam passing through scan lens 22 causes a focussed spot to move in a raster-like fashion along an imaging line on material 24. The beam angle that is swept out during imaging by a given mirror facet is approximately 60°. During this period, information contained in the modulated beam exposes photosensitive material 24 in a sweep or scan manner. Since the beam sweep caused by one facet occurs one-half a revolution of mirror 20 later than the beam sweep caused by the other facet, there are dead times (retrace intervals) of approximately 120° each between these two active scan periods (trace intervals). During these dead times, control circuitry 17 switches the scanning beam ON so that the start of a scanning line can be detected by a photocell 25 and a monostable multivibrator delay circuit 31 generates a Start Of Line (S.O.L.) signal which is described in greater detail with respect to FIG. 5. At a prescribed interval following detection of light beam 18 by photocell 25, the scanning beam is modulated in response to the externally applied video signal to expose the photosensitive material along the imaging line in accordance with the text and/or graphics to be produced.

Either during or after the completion of a scan line, the photosensitive material is advanced to the next scan line position by incrementing a drive roller 28 by means of a stepper motor 29 and a worm gear mechanism 30. The stepper motor is controlled by a drive circuit 32 which supplies current to the coils of motor 29 to advance prescribed amounts, e.g., 1/1200 inches per increment.

As the photosensitive material 24 is exposed, it is collected in light-tight receptacle 14. At the completion of an imaging run, the material is advanced further so that all of the exposed portions of photosensitive material 24 is transported into receptacle 14. The exposed material is then severed from the unexposed material by means of a cutter 26, actuated manually by a lever 27, and chamber 14 containing the exposed material is carried to a developing station.

Figure 5:
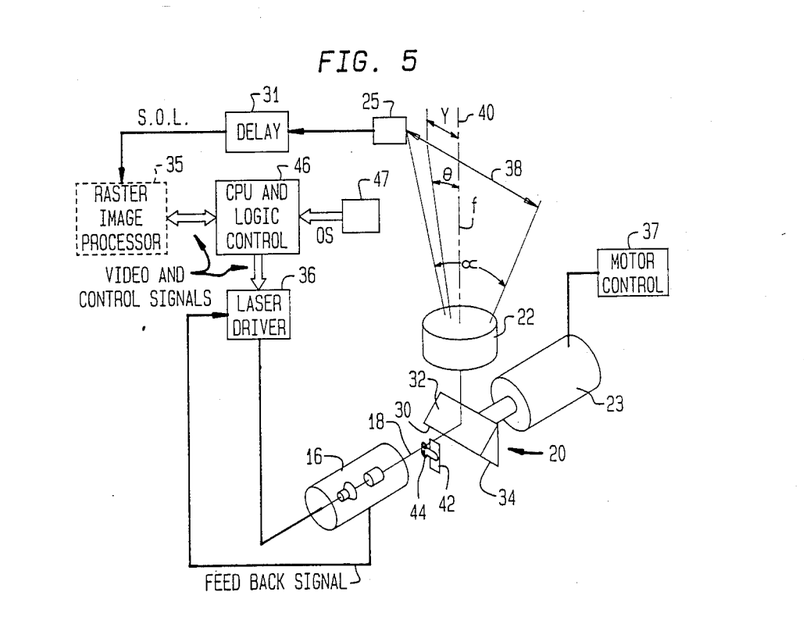
FIG. 5 schematically illustrates the essential electrical portions of the imagesetter of FIGS. 2 and 3.

FIG. 5 shows schematically some of the essential components of imagesetting apparatus in accordance with the principles of the invention. As is shown there, infrared light beam 18 is directed toward one facet 32 of rotating prism mirror 20. The other facet 34 of mirror 20 meets facet 32 along a common line 30 that is Perpendicular to the prism axis of rotation. Mirror 20 is rotated at a constant speed by synchronous motor 23. The speed of motor 23 is accurately controlled by a conventional motor control circuit 37. A solenoid 42 controls a filter assembly 44 in order to selectively filter beam 18 as it is directed towards mirror 20. The purpose for filter assembly 44 will be made clear later on.

The reflected beam 18 passes through lens 22, which focusses the beam into a spot on the photosensitive material (not shown) along an imaging line 38. The scanning beam sweeps out a maximum angle during imaging by a given one of mirror facets 32 or 34. The instantaneous position of beam 18 is shown at an angle $\theta$ with respect to optical axis 40 of lens 22. With beam 18 at such an angle, it is focussed along imaging line 38 at a distance Y from optical axis 40. Imaging line 38 is perpendicular to optical axis 40 and at a distance f from scan lens 22, where f is the effective focal length of the scan lens.

Scan lens 22 is constructed and arranged to focus beam 18 during scanning at all points along imaging line 38. In particular, lens 22 maintains the relationship $Y = f\theta$, thereby compensating for variations in image focus introduced by the deviations of the beam from optical axis 40. Scan lens 22 is a convention f-theta lens, is preferably made up of three individual lenses, and operates in accordance with the principles described in U.S. Pat. No. 3,687,025 issued to Rosin.

As previously noted, delay 31 generates a Start Of Line (S.O.L.) signal which is used to control the timing of the start of image modulation of the laser current. The S.O.L. signal is applied to a raster image processor 35, shown in dashed lines, which is generally not part of an imagesetter. Conventionally, a raster image processor is that equipment which supplies raster scan timing and control signals in conjunction with a video information signal to an imagesetter, the combination of the imagesetter with the raster image processor is commonly called a typesetter or page imagesetter.

A central processing unit (CPU) interface control logic unit 46 receives the video and raster scan control signals from raster image processor 35 and applies them to a laser driver 36. A feedback signal representative of the optical output power of the laser diode is also applied to laser driver 36. The feedback signal is generated by a photodiode which is conventionally included in the integrated circuit package of laser diode source 16.

Laser driver 36 includes a sample and hold circuit for sampling the feedback signal when the laser diode is ON during the scan retrace intervals and then uses the sampled signal for setting the ON current level of the laser diode for the next scan trace interval. CPU 46 also receives operator/user generated operating control signals (OS) from operator controls 47 which e.g., allows the operator to select the operating resolution of the imagesetter and in response provides control signals (not shown) to motors 23 and 32 for controlling the scanning of the beam and control signals to laser driver 36 to control the optical power output of the laser diode so as to cause operation of the imagesetter in the selected resolution mode. More specific details concerning the electrical and mechanical components described thus far, except laser driver 36 and filter assembly 44 to be described next, can be found in the previously noted U.S. patent application Ser. No. 757,129 of Hansen et al., incorporated herein by reference.

Figures 6, 8:
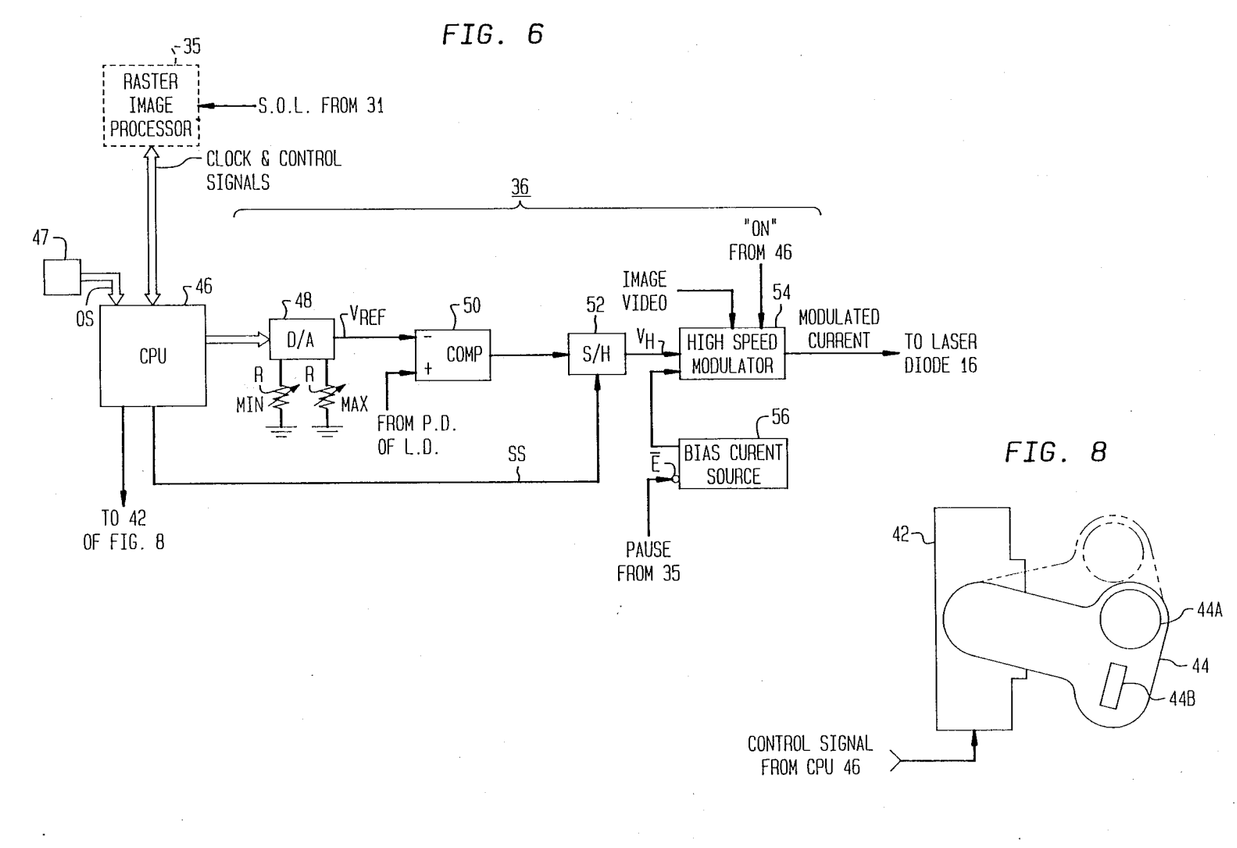
FIG. 6 schematically illustrates details of the laser driver portion of FIG. 5.
FIG. 8 filter assembly which, in accordance with the principles of the invention, is used in conjunction the imagesetter of FIGS. 3–6.

As shown in FIG. 6, CPU 46 transmits and receives control signals to and from raster image processor 35. CPU 46 provides voltage representative digital signals corresponding to a preprogrammed optical power output level e.g., for a selected resolution mode, to a conventional digital-to-analog (D/A) converter 48. D/A converter 48 includes adjustable resistors R for setting the minimum and maximum voltage levels of a selectable range for an analog reference voltage $V_{ref}$ generated in response to the digital signals. A comparater 50, which may comprise a high gain inverting amplifier, receives the feedback signal from the photodiode of laser diode source 16 at its inverting (−) input and the $V_{ref}$ signal at its non-inverting (+) input. A sample and hold circuit 52 samples the output of comparator 50 in response to a sample signal (SS) generated by CPU 46 a predetermined time period after the S.O.L. signal. In the present embodiment the scan retrace interval starts 2.5 milliseconds after the S.0.L. signal. A high speed modulator 54, which may comprise, e.g., a high speed amplifier, has one input responsive to the voltage signal $V_H$ held by sample and hold circuit 52 and another input responsive to the image representative video signal. Modulator 54 is also responsive to an ON signal from CPU 46 for turning ON the laser diode during, e.g., each of scan retrace intervals.

In the prior art, modulator 54 provides a given output, such as $V_H$ when the video signal indicates the laser is to be ON, and a low output signal, such as 0 volts, when the laser is to be OFF, for modulating the foward current of the laser diode. However, as previously noted, this results in a large change in input current to the laser diode and hence causes internal temperature variations which can cause undesirable image distortions. Thus, in accordance with one aspect of the present invention, a bias current source 56 provides a bias current of e.g., 40 milliamps, to modulator 54. In response, modulator 54 provides a drive current of 40 milliamps to laser diode 16 when the image representative video signal is OFF. This corresponds to an optical output power of 0.1 milliwatts from the laser diode, which is low enough to not fog the photosensitive material during normal scanning.

Figure 7A:
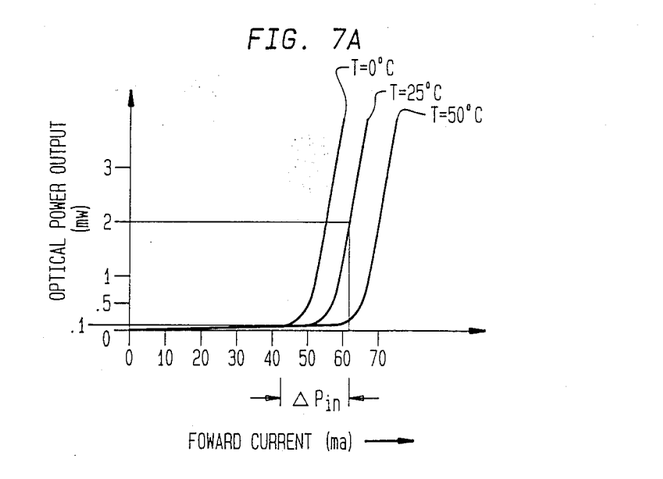
FIGS. 7a, 7b and 7c illustrate optical power output vs. foward current plots for a laser diode which are useful for explaining the need for a filter assembly which, in accordance with the principles of the invention, is used in conjunction with the imagesetter of FIGS. 3–6.
Figure 7B:
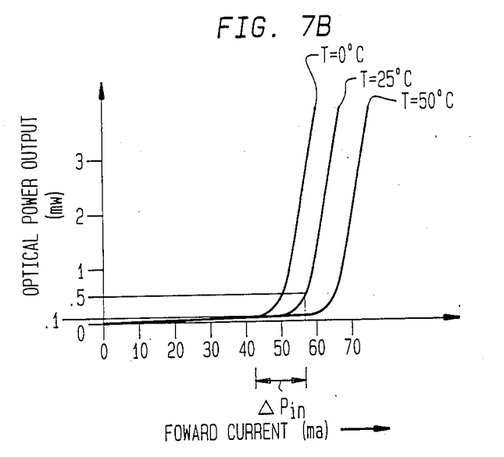
Figure 7C:
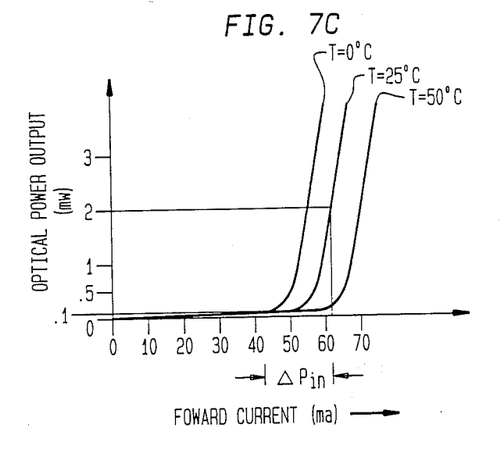

FIGS. 7a, 7b and 7c illustrate optical power output vs. foward current plots for laser diode 16. As illustrated in FIG. 7a, the addition of the bias current into the laser driver reduces the range of input power variation applied to the laser diode and therefore reduces its internal temperature variations. At the standard 1,200 dpi operation of the imagesetter, the addition of the bias current results in laser diode variations of less than 1%, thereby overcoming image distortion problems of the type described in conjunction with FIG. 2. Bias current source 56 has an inverting enable ($\overline{E}$) input responsive to a pause signal from CPU 46 for turning off the bias current when the imagesetter is in the pause mode, so as to prevent fogging of the photosensitive material caused by repeated scanning of the same scan line.

Unfortunately, when the operator/user changes the resolution mode of the imagesetter to a higher resolution (via controls 47), as well known, a reduced laser diode output power is required. FIG. 7b illustrates what would happen at the reduced output power operation of the laser diode. Although the change in input power is minimized, just as in FIG. 7a, the extinction ratio (laser diode output power when ON divided by the output power when OFF) is greatly reduced. This translates into low image quality and high signal to noise in the set image. Consequently, in accordance with a further aspect of the present invention, when selecting a higher resolution mode for the imagesetter, the laser diode optical output power is increased over that amount required for proper operation at the higher resolution mode, under the control of the digital signals supplied to D/A converter 48 from CPU 46, thereby improving the extinction ratio of the laser diode. A neutral density filter 44 is used to reduce the optical output power of the laser diode to the proper level. FIG. 7c illustrates the operation of the laser diode at the higher resolution mode.

FIG. 8a illustrates that filter assembly 44 is selectively interposed into the path of light beam 18 by the operation of solenoid 42 in response to a control signal (not shown) from CPU 46. Filter assembly 44 includes a neutral density filter 44a which interposes light beam 18 during the high resolution mode and an aperture, which in a preferred embodiment comprises a slot 44b, for interposing light beam 18 during the standard resolution mode. It should be understood that although aperture 44b is shown as a slot, this opening can be round (like filter 44a) if desired. By use of slotted aperture 44b, a nominal 25 micron beam spot can be enlarged to an elliptical 25 by 50 micron beam spot at the image point on the photosensitive material. Since aperture 44b also reduces the light energy which reaches the photosensitive material, when aperture 44b is used it is also necessary to increase the optical power output of the diode, thereby further improving the extinction ratio in a manner similar to that provided by filter 44a.

Slotted aperture 44b is oriented such that the long dimension of the elliptical spot on the image point is arranged vertically with respect to the imaged text or graphics on the photosensitive material. With the aperture in place, the elongated spot will ensure proper fill-in between successive scan lines as the film is advanced with a coarse vertical resolution (e.g., 800 lines per inch or less). When the film is advanced with a fine vertical resolution (e.g., up to 2,400 lines per inch), round filter 44a is used. Actuation of solenoid 42 can take place automatically, in dependence upon the operator's selection of the vertical resolution, or it can be controlled independently by the operator.

Thus, there has been shown and described novel apparatus for stabilizing the optical output power of a laser diode in a multi-resolution imagesetter. Many changes, modifications, variations and other uses and applications of the subject invention will, however, become apparent to those skilled in the art after considering this specification and its accompanying drawings which disclose preferred embodiments thereof. For example, the filter assembly could have different types of filters for use during the various resolution modes, such as a filter having a different wavelength filtering characteristics. Additionally, the aperture can be of a different shape. Furthermore the bias current could be applied to the laser diode using a different type of laser driver, i.e., a laser driver level control which is open-looped could be used instead of the sample and hold closed-loop system described herein. All such changes, modifications, variations and other uses and applications which do not depart from the spirit and scope of the invention are deemed to be covered by the invention which is limited only by the following claims.

We claim:

1. Imagesetting apparatus for selectively producing a two-dimensional image on photosensitive sheet material in either one of a first resolution or a second resolution greater than said first resolution, comprising:

means for transporting said photosensitive sheet material past an image point in a first direction to provide a first dimension of said two-dimensional image on said photosensitive material;

controllable laser diode light source means responsive to an image-representative signal for producing a light beam, said image-representing signal varying between an OFF-state and a ON-state, and the energy of said light beam having a dependency on an internal temperature within said laser diode light source means and being modulated in accordance with said image-representative signal;

means in the path of said modulated light beam for converting said light beam into a focussed beam spot which moves repeatedly in a second direction across said photosensitive material at said image point to provide a second dimension of said two-dimensional image on said photosensitive material;

filter means selectively interposed in the path of said light beam for controllably attenuating the optical power of said light beam;

control means coupled to each of said above-mentioned means for causing said imagesetter to reproduce said image in one of said first and second resolutions; and bias current means coupled to said laser diode light source means for causing a bias current to be applied to said laser diode light source means irrespective of the selection of said first or said second resolution of said imagesetter apparatus, said bias current keeping said internal temperature at an elevated level during said OFF-state of said image-representative signal.

2. Apparatus according to claim 1, wherein:

when said control means causes said imagesetting apparatus to change to said second resolution from said first resolution, said control means also causes the optical power output of said laser diode light source means to be increased a given amount over that amount necessary for proper operation at said second resolution and said filter means is caused to attenuate said light beam said given amount.

3. Apparatus according to claim 2, wherein said laser diode light source means comprises:

a controllable laser diode light source for producing a light beam; and modulating means coupled to said controllable laser diode light source for modulating said light beam in response to said image-representative signal.

4. Apparatus according to claim 3 wherein:
said bias means is connected to supply a bias current to said modulating means; and
said modulating means adds said bias current to said image-representative video signal for generating a modulating current signal for controllably modulating said laser diode light source.

5. Apparatus according to claim 4, wherein:
said laser diode light source comprises an integrated circuit package having a semiconductor laser diode and a photodiode detector therein, said detector providing an output electrical signal representative of the optical power output of said semiconductor laser diode.

6. Apparatus according to claim 5, wherein:
said controllable laser diode light source means further includes:
a laser driver including a sample and hold circuit for selectively sampling the optical output of the laser diode via the electrical signal from the said photodiode detector, for controlling the optical power output of said semiconductor laser diode when ON.

7. Imagesetting apparatus for selectively producing a two-dimensional image on photosensitive sheet material in either one of a first resolution or a second resolution greater than said first resolution, comprising:
means for transporting said photosensitive sheet material passed an image point in a first direction to provide a first dimension of said two-dimensional image on said photosensitive material;
controllable laser diode light source means responsive to an image-representative signal for producing a light beam, said image-representative signal varying between an OFF-state and ON-state, and the energy of said light beam having a dependency on an internal temperature within said laser diode light source means and being modulated in accordance with said image-representative signal;
means in the path of said modulated light beam for converting said light beam into a focussed beam spot which moves repeatedly in a second direction across said photosensitive material at said image point to provide a second dimension of said two-dimensional image on said photosensitive material;
filter means selectively interposed in the path of said light beam for controllably attenuating the optical power of said light beam;
control means coupled to each of said above-mentioned means for causing said imagesetter to reproduce said image in one of said first and second resolutions; and
bias current means coupled to said laser diode light source means for applying a bias current to said laser diode light source means when the second resolution of said imagesetting apparatus is selected, said bias current keeping said internal temperature at an elevated level during said OFF-state of said image-representative signal, said control means causing the optical power output of said laser diode light source means to have a level which is increased by a given amount above that which is normally required for producing an image on said photosensitive material at said second resolution and then causing said filter means to attenuate said light beam by said given amount.

8. A method for controlling a multi-resolution mode image setting apparatus including a controllable semiconductor laser diode for providing a light beam, the energy of said light beam having a dependency on an internal temperature within said laser diode, said image setting apparatus further including an apparatus for causing scanning of said light beam after it has been modulated with image-representative information including OFF-states and ON-states, so as to set an image in a selected one of first and second resolutions, said second resolution being greater than said first resolution, comprising the following steps:
(a) keeping said internal temperature at an elevated level during said OFF-states by applying a bias current to said laser diode irrespective of the selection of said first or second said resolution of said apparatus;
(b) electrically controlling the optical power output of said laser diode when changing to said second resolution from said first resolution so that said optical power output is a given amount greater than that necessary for proper setting of said image at said second resolution; and
(c) optically attenuating said light beam so as to reduce the optical power of said light beam by said given amount in order that setting of images in said second resolution can take place.

9. A method in accordance with claim 8, wherein:
said electrical increasing step comprises increasing the current used to drive said laser diode.

10. A method according to claim 9, wherein:
said optical attenuating step comprises filtering said light beam with a neutral density filter.

11. Imagesetting apparatus for selectively producing a two-dimensional image on photosensitive sheet material in either one of a first resolution or a second resolution greater than said first resolution, comprising:
(a) means for transporting said photosensitive sheet material passed an image point in a first direction to provide a first dimension of said two-dimensional image on said photosensitive material;
(b) a laser diode package including a laser diode fed by a laser driving current for producing a modulated light beam, the optical power output of said laser diode having a dependency on an internal temperature within said laser diode, said laser diode package further including a photodetector for generating a feedback signal reflecting the optical power output of the laser diode;
(c) a diode current driver responsive to an image-representative signal varying between an OFF-state and an ON-state, said diode current driver producing said laser driving current modulated in accordance with said image-representative signal, said diode current driver including modulator means fed by said image-representative signal, and feedback signal storage means fed by said feedback signal and coupled to said modulator means for adjusting the maximum level of said laser driving current to a preset maximum value corresponding to said ON-state of said image-representative signal;
(d) means in the path of said modulated light beam for converting said light beam into a focussed beam spot which moves repeatedly in a second direction across said photosensitive material at said image point to provide a second dimension of said two-dimensional image on said photosensitive material;

(e) filter means selectively interposed in the path of said light beam for controllably attenuating the optical power of said light beam;

(f) operation control means coupled to each of said above-mentioned means for causing said imagesetter to reproduce said image in one of said first and second resolutions, said operation control means presetting said maximum value such that it, at least in the second resolution, exceeds by a given amount that laser driving current level which is normally required for producing an image on said photosensitive material at said one resolution and then, at least in said second resolution, causing said filter means to attenuate said light beam by said given amount; and (g) bias current control means coupled to said diode current driver for adjusting a bias level of said laser driving current during said OFF-state of said image-representative signal, in order to keep said internal temperature at an elevated level.

12. Apparatus according to claim 11, wherein said feedback signal storage means includes:

a sample and hold circuit for selectively sampling said feedback signal during a period of time when said laser driving current is at its maximum level.

13. Apparatus according to claim 12, wherein said feedback signal storage means further includes:

level adjusting means fed by said feedback signal and said preset maximum value, the output signal of said feedback signal storage means being applied to said modulator for modulation between said maximum level and a minimum level preset by said bias current control means.

* * * * *

UNITED STATES PATENT AND TRADEMARK OFFICE
CERTIFICATE OF CORRECTION

PATENT NO. : 4,803,497

DATED : February 7, 1989

INVENTOR(S) : John A. Kennedy, Walter Hansen

It is certified that error appears in the above-identified patent and that said Letters Patent is hereby corrected as shown below:

Cover Page
Section [45] delete "Feb. 7, 1988" and insert in its place
--Feb. 7, 1989--.

Signed and Sealed this

Twentieth Day of June, 1989

Attest:

DONALD J. QUIGG

Attesting Officer

Commissioner of Patents and Trademarks